(12) United States Patent
Kim et al.

(10) Patent No.: US 6,667,566 B2
(45) Date of Patent: Dec. 23, 2003

(54) PIEZOELECTRIC TRANSFORMER FOR FLUORESCENT LAMP

(75) Inventors: Jong Sun Kim, Kyungki-do (KR); Choong Sik Yoo, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 15 days.

(21) Appl. No.: 09/846,191

(22) Filed: May 2, 2001

(65) Prior Publication Data

US 2001/0038259 A1 Nov. 8, 2001

(30) Foreign Application Priority Data

May 4, 2000 (KR) .......................... 2000-23903

(51) Int. Cl.[7] .......................... H01L 41/04; H01L 41/08; H01L 41/18; H02N 2/00
(52) U.S. Cl. ................. 310/366; 310/365; 310/367; 310/319; 310/318; 310/311
(58) Field of Search ............... 310/365–367, 310/318–319, 311, 300

(56) References Cited

U.S. PATENT DOCUMENTS

| | | | | |
|---|---|---|---|---|
| 4,431,935 A | * | 2/1984 | Rider ........................ | 310/331 |
| 5,281,935 A | * | 1/1994 | Knecht et al. .............. | 310/348 |
| 5,331,344 A | * | 7/1994 | Miyagawa et al. .......... | 347/65 |
| 5,440,195 A | * | 8/1995 | Ohnishi et al. ............. | 310/359 |
| 5,757,104 A | * | 5/1998 | Getman et al. ............. | 310/317 |
| 5,814,922 A | * | 9/1998 | Uchino et al. .............. | 310/359 |
| 6,037,706 A | | 3/2000 | Inoi et al. .................. | 310/359 |
| 6,188,163 B1 | * | 2/2001 | Danov ....................... | 310/366 |
| 6,418,789 B1 | * | 7/2002 | Ishitoko et al. ............. | 73/504.12 |
| 6,492,763 B2 | * | 12/2002 | Kim et al. .................. | 310/358 |
| 6,495,947 B1 | * | 12/2002 | Kim et al. .................. | 310/358 |
| 6,509,699 B2 | * | 1/2003 | Kim et al. .................. | 315/291 |
| 6,533,957 B2 | * | 3/2003 | Kim et al. .................. | 252/62.9 PZ |
| 6,544,433 B1 | * | 4/2003 | Kim et al. .................. | 252/62.9 PZ |
| 6,566,820 B2 | * | 5/2003 | Kim et al. .................. | 315/209 PZ |

OTHER PUBLICATIONS

"Design of Fluorescent Lamp Ballast with PFC Using a Power Piezoelectric Transformer", Sung–Jin Choi et al, IEEE (Feb. 15, 1998), pp. 1135–1141.

* cited by examiner

*Primary Examiner*—Nestor Ramirez
*Assistant Examiner*—Pedro J. Cuevas
(74) *Attorney, Agent, or Firm*—Lowe Hauptman Gilman & Berner LLP

(57) ABSTRACT

In a piezoelectric transformer for a fluorescent lamp, the size of an electrode at a central region of each side on a first face is smaller than that of electrodes at the corner region thereof. As a result, the stress generated in the piezoelectric block is minimized and the heat caused by stress is prevented, so that the damage of the piezoelectric block and the deterioration of the efficiency may be prevented. The input electrode can be formed in various shapes such as diamond, cross, and rhombic shapes.

4 Claims, 6 Drawing Sheets

PIEZOELECTRIC TRANSFORMER FOR FLUORESCENT LAMP

BACKGROUND OF THE INVENTION

The present invention relates to a piezoelectric transformer, and more particular to the piezoelectric transformer for a fluorescent lamp including a piezoelectric block having smaller electrodes at the center region of each side than that at corner regions to minimize the stress at the center region of the piezoelectric block in order to use for general fluorescent lamp.

Since $BaTiO_3$ has been introduced at the mid-1940s as a piezoelectric ceramic material, ceramic materials having good piezoelectric characteristics, such as $Pb(Zr,Ti)O_3$ (PZT), have been found to be useful for electrical devices. The PZT which is the solid solution of $PbZrO_3$ and $PbTiO_3$ is a 2-element based perovskite structure having good piezoelectric characteristics. Recently, 3-element based perovskite has been studied to vary easily the composition of the 2-element based perovskite and to improve the piezoelectric characteristics. For example, $Pb(Mg,Nb)O_3$—$Pb(Zr,Ti)O_3$, $Pb(Mg,Ta)O_3$—$Pb(Zr,Ti)O_3$, and $Pb(Mn,Nb)O_3$—$Pb(Zr,Ti)O_3$ are developed as 3-element based complex perovskite compounds.

FIGS. 1A–1B show an applicable example of the piezoelectric material, i.e., a band pass filter for the amplitude modulation. FIG. 1A is a plan view of the band pass filter and FIG. 1B is a sectional view along the line A—A of FIG. 1A. As shown therein, the band pass filter comprises a piezoelectric block having a hexahedron shape and having electrodes on the upper and lower faces thereof. The electrodes on the upper face are input/output electrodes 3 and 5 and the electrode on lower face is a common electrode 7.

When the AC voltage corresponding to the resonant frequency is supplied to the input electrode 3, the electrical signal is converted into a strong mechanical vibration near the input electrode and the converted vibration is transmitted to the output electrode. As a result, a voltage proportional to the resonant frequency is outputted from the output electrode 5.

Piezoelectric materials have been introduced at the end of the 1910s and applied to various electronic devices such as a high voltage generator, an ultrasonic generator, sound facilities, a 45.5 KHz IF filter for AM radio and a 10.7 MHz filter for FM radio, communication devices, and various sensors. Further, this piezoelectric material has been used for a resonator or filter for communication devices, and an inverter of a cold cathode tube for a backlight of a liquid crystal display. In addition, a piezoelectric transformer used for an inverter has also been introduced.

The structure of a typical transformer composed of a piezoelectric material is shown in FIGS. 2A–2B. FIG. 2A is a perspective view and FIG. 2B is a sectional view. This transformer is Rosen type transformer having vibrations modes in the thickness and length directions. As shown therein, the transformer is polarized in the thickness direction at an input electrode region on a part of the upper and lower faces. In an output electrode region, further, it is polarized in the length direction. When the AC voltage corresponding to the resonant frequency is supplied to the input electrodes 3a and 3b to raise the voltage of the piezoelectric transformer, the supplied electrical signal is converted into a strong mechanical vibration of the length direction near the input electrodes and then transmitted to the output electrode to generate the longitudinal vibration. Then, the longitudinal mechanical vibration is outputted from the output electrode 5 as an increased high voltage having a high frequency that is identified with the frequency of the voltage supplied to the input electrode.

The increase of the voltage at the output electrode is maximized when the frequency of the input voltage is identified with the mechanical vibration frequency at the output electrode. Further, the voltage-increase ratio of the piezoelectric transformer, which is dependant upon the load impedance of the material, is maximized when a relatively high load impedance is applied to the output electrode. In case of lower load impedances, the voltage increase ratio is less than several tens times.

When the piezoelectric transformer is used for a lamp such as a cold cathode tube and a fluorescent lamp, it has a different load impedance in accordance with the kind of lamp. However, if the piezoelectric transformer is made under optimum fabrication conditions, the high voltage-increase ratio can be maintained under the condition of a lower load impedance. In the normal state that the impedance is decreased after lighting, further, the voltage-increase ratio can suitably be maintained so that the piezoelectric transformer can be used for a lamp such as a cold cathode tube and a fluorescent lamp.

Recently, a piezoelectric transformer having an outline vibration mode shown in FIGS. 3A–3B has also been introduced. As shown in FIGS. 3A–3B, a piezoelectric transformer of an outline vibration mode has a structure similar to that of the band pass filter shown in FIGS. 1A–1B except for the shape of the electrodes. That is, the electrode in FIG. 3A has a circular shape, rather than a rectangular shape as in FIG. 1A. In this piezoelectric transformer, the output electrode 5 is disposed on the upper face of the piezoelectric block 1 at a predetermined distance from the input electrode 3 and the common electrode 7 is disposed on the lower face of the piezoelectric block 1.

When a voltage is supplied to the piezoelectric block 1 through the input electrode 3, the electrical signal is converted into a mechanical vibration directed to a side portion from the central portion of the piezoelectric block 1 and then the signal proportional to the mechanical vibration is outputted though the output electrode 5. This piezoelectric transformer may be used for a liquid crystal display of a notebook computer and a low-consumption transformer.

There, however, is a problem in that piezoelectric materials are not applicable to high power transformers. Since the Rosen or the deposited Rosen type piezoelectric transformer (U.S. Pat. No. 6,037,706) has a complex structure and outputs a low output signal, it is not applicable to a fluorescent lamp. In the outline vibration mode-piezoelectric transformer, the deposited structure of the piezoelectric material should be studied because of the problem of the material. The electrodes of the circular and rectangular shapes in the outline vibration mode-piezoelectric transformer are disclosed in 'Design of Fluorescent lamp with PFC using a power piezoelectric transformer, Sung Jin Choi, IEEE(1998. 2. 15), P1141'. In this transformer, however, there is a problem that the output signal is low.

Further, there is a problem in that the stress is maximized in a part of the piezoelectric block so that the piezoelectric device may be destroyed and the efficiency thereof may be deteriorated, when the electrical signal is converted into the mechanical vibration.

SUMMARY OF THE INVENTION

It is an object of the present invention to provide a piezoelectric transformer in which the electrode at the low vibration region of the piezoelectric block, that is, the central region of each side is minimized to eliminate the heat caused by the stress and prevent the damage of the piezoelectric block.

In order to achieve the object, in the piezoelectric transformer of the present invention, the size of the electrode at the stress generation region on the upper face of the piezoelectric block is decreased to minimize the heat caused by the stress. The stress is chiefly generated near the central region of each side of the piezoelectric block. By minimizing the size of the electrode at this region, thus, the stress is also minimized and as a result, this piezoelectric transformer is applicable to high power transformers. For the minimized electrode, the electrode can be formed in the diamond shape or a cross shape. The shape of the electrode can be formed in various shapes, without limitation.

BRIEF DESCRIPTION OF THE DRAWINGS

FIG. 7 is a view showing the structure of a piezoelectric transformer for a fluorescent lamp according to still another embodiment of the present invention.

DETAILED DESCRIPTION OF THE INVENTION

In general, a back light used for a liquid crystal display device has a Rosen type-piezoelectric transformer. This Rosen type piezoelectric transformer used as the lighting device of the cold cathode tube has a high voltage and low current characteristics so that it is not applicable to a fluorescent lamp. During lighting, the impedance of a general fluorescent lamp is less than few KΩ, while the impedance of a cold cathode tube is approximately 80–100KΩ. Thus, the impedance of a general fluorescent lamp is far less than that of a cold cathode tube.

This invention provides a piezoelectric transformer applicable to a fluorescent lamp. To fabricate this piezoelectric transformer, in this invention, the electrodes have a different structure from that of the conventional piezoelectric transformer. By this electrode structure, the maximum stress is generated at a different region from that of conventional piezoelectric transformers and as a result, the desired current and voltage may be obtained.

Hereinafter, a piezoelectric transformer according to the present invention will be described in detail, accompanying drawings.

Figure 1A:
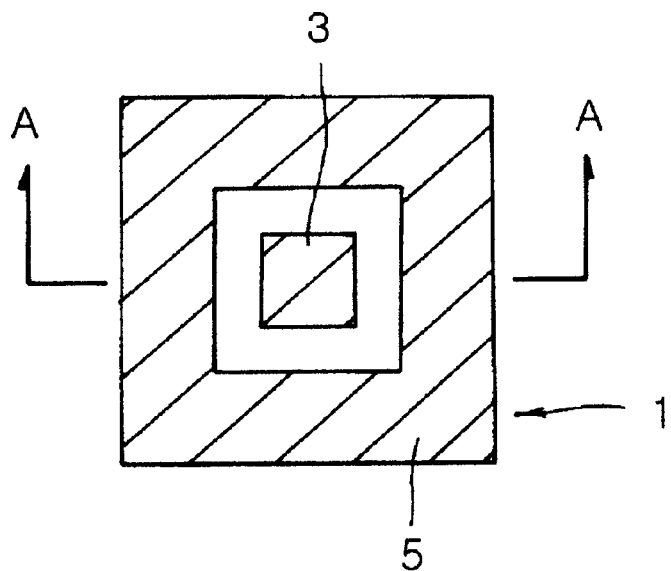
FIGS. 1A–1B are views showing the structure of a conventional band pass filter using a piezoelectric material.
Figure 1B:
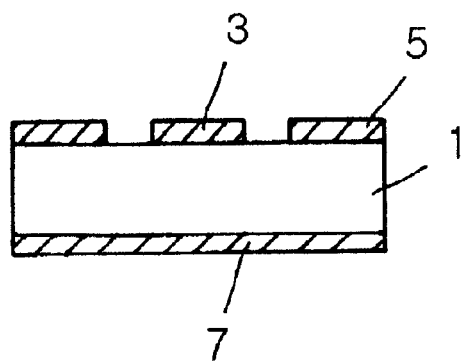
Figure 2A:
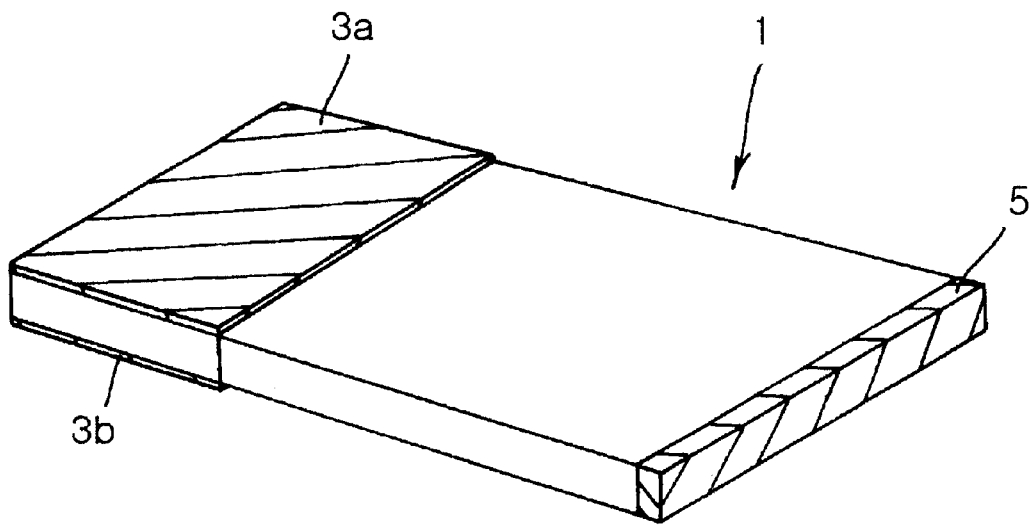
FIGS. 2A–2B are views showing the structure of a conventional piezoelectric transformer of Rosen type using a piezoelectric material.
Figure 2B:
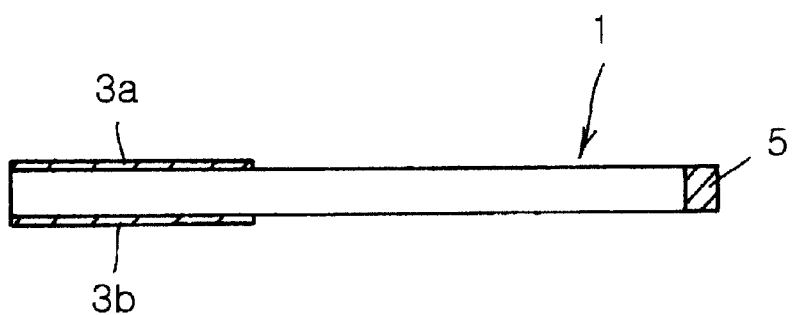
Figure 3A:
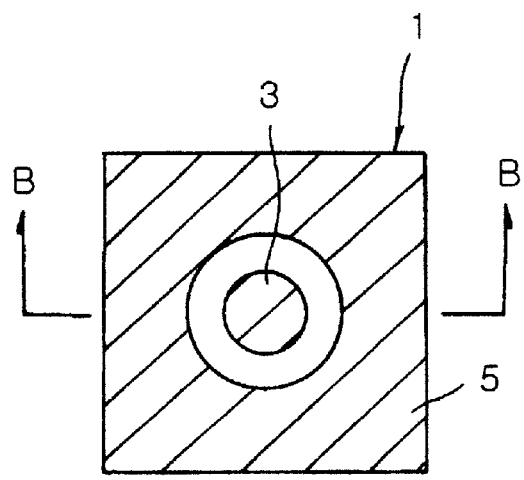
FIGS. 3A–3B are views showing the structure of a conventional piezoelectric transformer of outline vibration mode using a piezoelectric material.
Figure 3B:
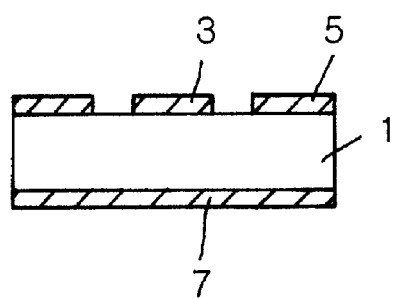
Figure 4A:
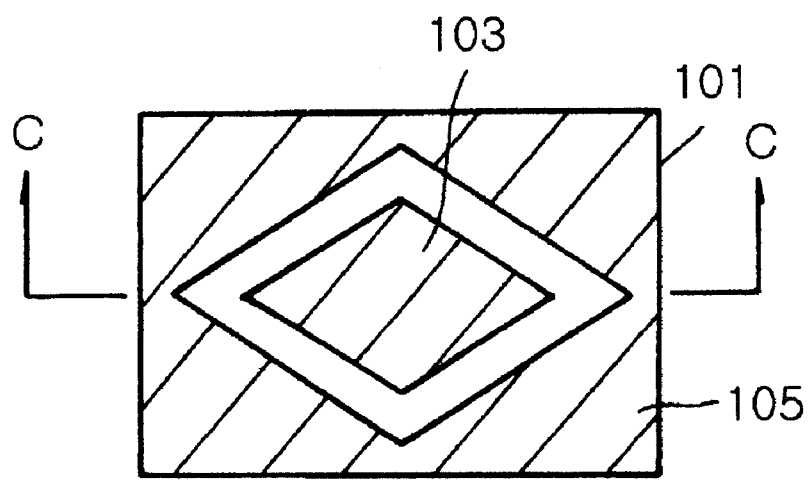
FIGS. 4A–4B are views showing the structure of a piezoelectric transformer for a fluorescent lamp according to one embodiment of the present invention.
Figure 4B:
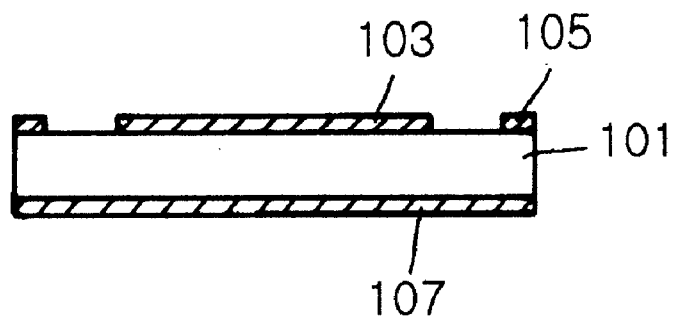

FIGS. 4A–4B are views showing a piezoelectric transformer in accordance with an embodiment of the present invention. FIG. 4A is a plan view and FIG. 4B is a sectional view. As shown therein, the piezoelectric transformer of the present invention comprises a piezoelectric block 101 having a hexahedral shape, the input/output electrodes 103 and 105 on the upper face of the piezoelectric block 101, and the common electrode 107 on the lower face of the piezoelectric block 101.

The input electrode 103 is substantially formed in a rhombic shape or the diamond shape and is separated from the output electrode 105 by a predetermined distance. The common electrode 107 is integrally formed on at least a part of the lower face of the piezoelectric block 101.

In this piezoelectric transformer, when an electrical signal is inputted through the input electrode 103 and the common electrode 107, the electrical signal is converted into a mechanical vibration of the outline vibration mode within the piezoelectric block 101 and then a signal proportional to the mechanical vibration is outputted through the output electrode 105.

Figure 5:
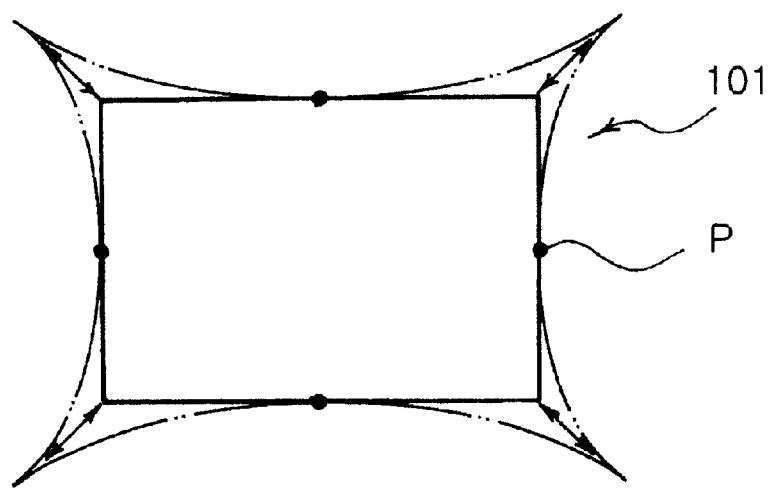
FIG. 5 is a view showing the mechanical vibration when a voltage is supplied to a piezoelectric transformer for a fluorescent lamp.

As shown by dash double-dot line of FIG. 5, when the voltage is supplied, the resultant vibration is maximized at the corner regions of the piezoelectric block, while minimized at the central region of each sides. In FIG. 5, an arrow in the corner region indicates the degree of the vibration in the piezoelectric block 101. The degree of vibration is dependant upon the piezoelectric material and the supplied voltage.

Since the mechanical vibration is maximized at the corner regions of the piezoelectric block 101 and minimized at the central region (indicated as P in FIG. 5) of the sides, as shown above, the maximum stress acts at the central region of the piezoelectric block 101 and the second highest stress acts at the central region of the sides of the piezoelectric block 101. By this stress, therefore, the heat is generated at the central region of the sides, so that the piezoelectric block may be damaged.

When the electrical signal is converted into the mechanical vibration, the vibration is strongly generated at the input/output electrodes. Thus, if the size of the electrode at the central region P of the sides is decreased, the degree of the vibration is also decreased. As a result, the less heat is generated at this region. The size ratio of the input electrode 103 and the output electrode 105 is preferably 1:1.5–1:3.14.

In order to form the electrode having above size ratio, the input electrode 103 is formed in a diamond shape. Thus, the area between the input and output electrodes 103 and 105 where the electrode is not disposed is extended near the central region P of the sides of the piezoelectric block 101 so that the size of the electrode is decreased at the region P.

In case where the input electrode 103 is formed in a diamond shape as shown above, the energy conversion efficiency is improved and the capacitance is increased to decrease the impedance at the output, because the electromechanical coupling coefficient Kp in the radius direction is higher than the coupling coefficient K31 in the length direction. As a result, the output power may be increased. Further, the increased ratio of the voltage is decreased so that this piezoelectric transformer is applicable to the lighting of a fluorescent lamp having a low impedance in the case of the input electrode 103 being of diamond shape.

It is not necessary to limit the shape of the input electrode 103 to the diamond shape. In other words, the electrode can be formed in any shape that the stress can be decreased in accordance with the decrease its size at the central region P of the sides of the piezoelectric block 101 to minimize the heat generation.

Figure 6A:
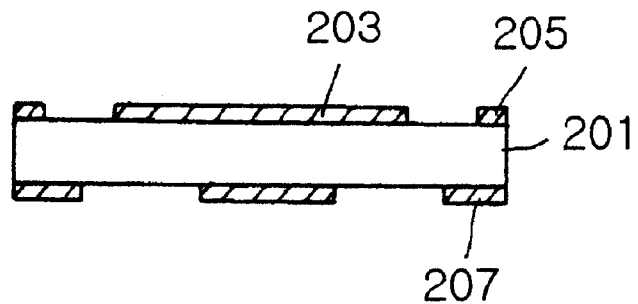
FIGS. 6A–6B are views showing the structure of a piezoelectric transformer for a fluorescent lamp according to another embodiment of the present invention.
Figure 6B:
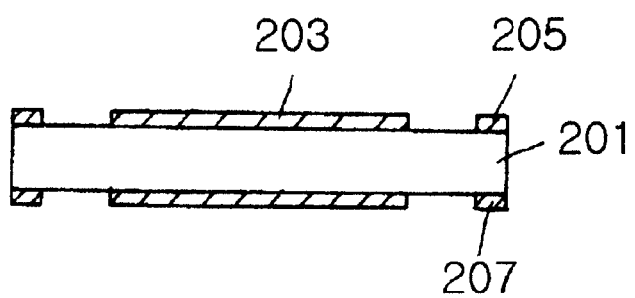

As shown in FIG. 4B, the common electrode 107 is integrally formed at a part on the lower surface of the piezoelectric block 101 and the input/output electrodes 103 and 105 are connected to the outer circuit (not shown in figure). In this case, the noise may be inputted from the outer circuit through the common electrode 107. In order to solve this problem, the common electrode 107 can be made in a plurality of isolated electrodes as shown in FIG. 6A. By this isolation of the common electrode 107, the noise cannot be inputted to the piezoelectric transformer from the outer circuit. In general, the common electrode 207 is formed in a different shape from those of the input electrode 203 and the output electrode 205, as shown in FIG. 6A. However, the common electrode 207 may be formed in the same shape as the input electrode 203 and the output electrode 205 as shown in FIG. 6B.

In the piezoelectric transformer of the present invention, as described above, the electrode at the central region of each side of the piezoelectric block has a smaller size than that of the electrode at the corner region. The input electrode can be formed in various shapes such as a diamond, rhombic, or cross shape. For example, the input electrode 303 can be formed in a cross shape as shown in FIG. 7. Further, the input electrode 303 at the central region of each side of the piezoelectric block 301 is smaller in size than that of the electrode at the corner region. The output electrode 305 is separated from the input electrode 303 by a predetermined constant distance at the peripheral region so that its size at the central region of each side is smaller than its size at the corner region.

As described above, the size of the electrode is minimized at the maximum stress generating area to decrease the stress. Thus, when the piezoelectric transformer is used as a high voltage transformer, the damage of the piezoelectric block or deterioration of the efficiency caused by the heat can be prevented.

While the invention has been described in its preferred embodiments, this should not be construed as a limitation on the scope of the present invention. Accordingly, the scope of the present invention should be determined not by the embodiments illustrated, but by the appended claims and their legal equivalents.

What is claimed is:

1. A piezoelectric transformer comprising:
    a piezoelectric block having first and second faces to convert an electrical signal into mechanical vibration by an outline vibration mode;
    an input electrode having a substantially diamond shape and disposed closer to a central region of each side than to a corner region on the first face of the piezoelectric block, the electric signal being inputted to the input electrode;
    an output electrode separated from the input electrode by a predetermined constant distance at a peripheral region on the first face so that its size at the central region of each side is smaller than its size at the corner region, the output electrode converting the mechanical vibration into an electrical signal and outputting the converted electric signal; and
    a common electrode on the second face of the piezoelectric block;
    wherein the length ratio of a side of the input electrode to a side of the output electrode is in the range of 1:15–1:3.14.

2. The piezoelectric transformer according to claim 1, wherein the common electrode is integrally formed on at least a part of the second face of the piezoelectric block.

3. The piezoelectric transformer according to claim 1, wherein the common electrode is formed on the second face of the piezoelectric block in a plurality of isolations to prevent the input of the noise.

4. The piezoelectric transformer according to claim 1, wherein the common electrode is facing the input and output electrodes.

* * * * *